US012584239B2

(12) United States Patent
Zwieback et al.

(10) Patent No.: US 12,584,239 B2
(45) Date of Patent: Mar. 24, 2026

(54) PHYSICAL VAPOR TRANSPORT SYSTEM COMPRISING A DOPING CAPSULE WITH INNER AND OUTER CRUCIBLES WITH A CAPILLARY CHANNEL FORMED IN AN INNER AND OUTER CRUCIBLE LID

(71) Applicant: II-VI ADVANCED MATERIALS, LLC, Pine Brook, NJ (US)

(72) Inventors: Ilya Zwieback, Washington Township, NJ (US); Varatharajan Rengarajan, Flanders, NJ (US); Andrew E. Souzis, Ramsey, NJ (US); Gary E Ruland, Morris Plains, NJ (US)

(73) Assignee: II-VI ADVANCED MATERIALS, LLC, Pine Brook, NJ (US)

( * ) Notice: Subject to any disclaimer, the term of this patent is extended or adjusted under 35 U.S.C. 154(b) by 70 days.

(21) Appl. No.: 18/655,053

(22) Filed: May 3, 2024

(65) Prior Publication Data

US 2024/0287705 A1    Aug. 29, 2024

Related U.S. Application Data

(62) Division of application No. 17/029,746, filed on Sep. 23, 2020, now Pat. No. 12,006,591.

(Continued)

(51) Int. Cl.
*C30B 35/00* (2006.01)
*C01B 32/956* (2017.01)
(Continued)

(52) U.S. Cl.
CPC ............ *C30B 23/02* (2013.01); *C01B 32/956* (2017.08); *C04B 35/573* (2013.01); *C04B 35/65* (2013.01);
(Continued)

(58) Field of Classification Search
CPC ....... C30B 23/00; C30B 23/02; C30B 23/002; C30B 23/005; C30B 23/06; C30B 29/00;
(Continued)

(56) References Cited

U.S. PATENT DOCUMENTS

| | | |
|---|---|---|
| 5,611,955 A | 3/1997 | Barrett et al. |
| 5,746,827 A | 5/1998 | Barrett et al. |

(Continued)

FOREIGN PATENT DOCUMENTS

| | | |
|---|---|---|
| CN | 101163824 A | 4/2008 |
| CN | 102560672 A | 7/2012 |

(Continued)

OTHER PUBLICATIONS

Atabaev B., et al., "Spectral Dependence of Optical Absorption of 4H—SiC Doped with Boron and Aluminum," Journal of Spectroscopy, 2018, Article ID. 8705658.

(Continued)

*Primary Examiner* — Kenneth A Bratland, Jr.
(74) *Attorney, Agent, or Firm* — Blank Rome LLP

(57) ABSTRACT

The present disclosure generally relates to a physical vapor transport system including a chamber, a growth crucible positioned within the chamber, the growth crucible sealable with a growth crucible lid, and a doping capsule positioned within the growth crucible. The doping capsule includes an outer crucible fitted with an outer crucible lid, an inner crucible fitted with an inner crucible lid, the inner crucible fitted with the inner crucible lid positioned within the outer crucible, and a capillary channel formed by a first aperture in the outer crucible lid and a second aperture in the inner crucible lid.

19 Claims, 4 Drawing Sheets

Related U.S. Application Data

(60) Provisional application No. 62/984,177, filed on Mar. 2, 2020.

(51) Int. Cl.

| | |
|---|---|
| *C04B 35/573* | (2006.01) |
| *C04B 35/65* | (2006.01) |
| *C30B 23/02* | (2006.01) |
| *C30B 29/36* | (2006.01) |
| *G02F 1/00* | (2006.01) |
| *H10D 62/60* | (2025.01) |

(52) U.S. Cl.

CPC ...... *C30B 29/36* (2013.01); *C04B 2235/3205* (2013.01); *C04B 2235/3826* (2013.01); *C04B 2235/3839* (2013.01); *C04B 2235/425* (2013.01); *C04B 2235/722* (2013.01); *C04B 2235/76* (2013.01); *C04B 2235/9661* (2013.01); *G02F 1/0063* (2013.01); *H10D 62/60* (2025.01)

(58) Field of Classification Search

CPC ......... C30B 29/10; C30B 29/36; C30B 35/00; C30B 35/002; C01B 32/956; C04B 35/573; C04B 35/65; C04B 2235/3205; C04B 2235/3826; C04B 2235/3839; C04B 2235/425; C04B 2235/722; C04B 2235/76; C04B 2235/9661; G01F 1/0063; H10D 62/60

USPC ...... 117/84, 88, 99, 102, 200, 204, 937, 951

See application file for complete search history.

(56) References Cited

U.S. PATENT DOCUMENTS

| | | | |
|---|---|---|---|
| 5,856,231 | A | 1/1999 | Niemann et al. |
| 7,601,441 | B2 | 10/2009 | Jenny et al. |
| 7,608,524 | B2 | 10/2009 | Gupta et al. |
| 8,040,044 | B2 | 10/2011 | Kang et al. |
| 8,216,369 | B2 | 7/2012 | Gupta et al. |
| 8,361,227 | B2 | 1/2013 | Zwieback et al. |
| 8,507,986 | B2 | 8/2013 | Arthur et al. |
| 8,858,709 | B1 | 10/2014 | Zwieback et al. |
| 9,017,629 | B2 | 4/2015 | Zwieback et al. |
| 9,090,989 | B2 | 7/2015 | Zwieback et al. |
| 9,484,284 | B1 | 11/2016 | Gambin et al. |
| 2002/0083890 | A1 | 7/2002 | Vodakov et al. |
| 2002/0170490 | A1 | 11/2002 | Vodakov et al. |
| 2006/0243984 | A1* | 11/2006 | Gupta ............... C30B 29/36 257/77 |
| 2013/0320275 | A1* | 12/2013 | Zwieback ........... H01B 3/025 117/84 |
| 2017/0321345 | A1 | 11/2017 | Xu et al. |

FOREIGN PATENT DOCUMENTS

| | | | |
|---|---|---|---|
| CN | 103472533 | A | 12/2013 |
| CN | 106894090 | A | 6/2017 |
| JP | S602106 | B2 | 1/1985 |
| JP | H09500861 | A | 1/1997 |
| JP | H09142995 | A | 6/1997 |
| JP | 2001085341 | A | 3/2001 |
| JP | 2009500861 | A | 1/2009 |
| JP | 2013173655 | A | 9/2013 |
| JP | 2015517451 | A | 6/2015 |
| JP | 2016052961 | A | 4/2016 |
| JP | 2017537052 | A | 12/2017 |
| JP | 2018039715 | A | 3/2018 |
| JP | 2018160641 | A | 10/2018 |
| KR | 20150013233 | A | 2/2015 |
| KR | 101819140 | B1 | 1/2018 |
| WO | 9504171 | A1 | 2/1995 |
| WO | 2013177496 | A1 | 11/2013 |
| WO | 2016049344 | A2 | 3/2016 |
| WO | 2016049344 | A3 | 5/2016 |
| WO | 2016049362 | A3 | 6/2016 |
| WO | 2017053883 | A1 | 3/2017 |

OTHER PUBLICATIONS

Cuia, et al., "Infrared Transmission and Reflectivity Measurements of 4H- and 6H—SiC Single Crystals," Materials Science Forum, 2015, vol. 821-823, S. 265-268.

Goela, et al., Transparent SiC for Mid-IR Windows and Domes, SPIE, 1994, vol. 2286, pp. 46-59.

Luan, et al., "Optical Ridge Waveguides in 4H—SiC Single Crystal Produced by Combination of Carbon Ion Irradiation and Femtosecond Laser Ablation," Optical Materials Express, 2014, vol. 4, No. 6, pp. 1166-1171.

Pankove J., "Optical Processes in Semiconductors," Dover Publications, NY, 1971, S.93; Soler F., "Multiple Reflections in an Approximately Parallel Plate," Optics Communications, 1997, vol. 139, pp. 165-169.

Scajev et al., "Application of a Time-Resolved Four-Wave Mixing Technique for the Determination of Thermal Properties of 4H—SiC Crystals," Journal of Physics D: Applied Physics, Feb. 2009 vol. 42, No. 5, p. 055413.

Singh, et al., "Nonlinear Optical Properties of Hexagonal Silicon Carbide," Applied Physics Letters, 1971, vol. 19, No. 2, pp. 53-56.

Sridhara, et al., "Absorption Coefficient of 4H Silicon Carbide from 3900 to 3250 A," Journal of Applied Physics, 1998, vol. 84, No. 5, pp. 2963-2964.

Tarekegne, et al., "Investigation of the Absorption Mechanisms of SiC for Lighting Applications," 6th International Workshop on Wideband Semiconductor Materials Devices, Fujian, China, 2018.

Wellmann, et al., "Optical Quantitative Determination of Doping Levels and Their Distribution in SiC," Materials Science and Engineering, 2002, Vo. 91-92, pp. 75-78.

Xu U.A., "Temperature Dependence of Refractive Indices for 4H and 6H," Journal of Applied Physics 2014, vol. 115 (113501), pp. 1-4.

Junhao C., et al., Semiconductor Materials Technology, Zhejiang Publishing Group Zhejiang Science and Technology Press, Feb. 28, 2010, p. 178, 3 Pages.

\* cited by examiner

1

PHYSICAL VAPOR TRANSPORT SYSTEM COMPRISING A DOPING CAPSULE WITH INNER AND OUTER CRUCIBLES WITH A CAPILLARY CHANNEL FORMED IN AN INNER AND OUTER CRUCIBLE LID

CROSS REFERENCE TO RELATED APPLICATIONS

This application is a Divisional of U.S. patent application Ser. No. 17/029,746, filed Sep. 23, 2023, which claims priority to U.S. Provisional Patent Application 62/984,177 filed on Mar. 2, 2020, the contents of which are incorporated herein by reference in their entirety.

FIELD

The present disclosure generally relates to silicon carbide crystals and methods for producing the same. More particularly, but not exclusively, the present disclosure relates to silicon carbide crystals which may be suitable for use in optical applications, and to methods for producing the same.

BACKGROUND

Unless otherwise indicated herein, the materials described herein are not prior art to the claims in the present application and are not admitted to be prior art by inclusion in this section.

Large, industrial-size silicon carbide (SiC) single crystals may be grown from the vapor phase through a sublimation technique commonly called Physical Vapor Transport (PVT). In this technique, a silicon carbide source, which may be in the form of a silicon carbon powder or grain, may be provided in a high temperature region of a crucible. A silicon carbide seed, such as a single-crystal silicon carbide plate or wafer of a 4H or 6H polytype, may be positioned in a lower temperature region of the crucible. The crucible may be heated to sublime the silicon carbide source and fill the crucible with the gaseous products of sublimation. The resulting vapors migrate to the cooler silicon carbide seed and deposit on the seed to grow a silicon carbide crystal boule of a desired polytype, diameter and thickness.

During sublimation growth, the silicon carbide crystal may be exposed to various impurities present in the growth system, and such exposure may lead to the formation of an impurity background in the crystal. Background impurities found in silicon carbide crystals include boron and nitrogen which, in some cases, may be present at levels as high as $n \cdot 10^{16}$ cm$^{-3}$. In silicon carbide crystals grown through sublimation, graphite may be a source of boron and nitrogen background impurities.

Optical properties of sublimation-grown bulk silicon carbide single crystals have been studied, and the overall character of optical absorption of a pure, undoped or, stated alternatively, not doped deliberately, hexagonal silicon carbide crystal is illustrated in Singh, et al. "Nonlinear optical properties of hexagonal silicon carbide", *Appl. Phys. Lett, Vol.* 19, 2 (1971) 53-56. This illustration suggests that the fundamental transparency region for silicon carbide crystals of this nature stretches from the band edge cut-off (about 380 nm for 4H and about 410 nm for 6H) to $\lambda \approx 4$ μm in the infrared, where it is terminated by the bands of multi-phonon absorption. A near-band-edge absorption shoulder has a magnitude of about 1 cm$^{-1}$ and is typical for undoped 4H—SiC and 6H—SiC crystals.

Optical properties of sublimation-grown 4H and 6H silicon carbide single crystals heavily doped with boron, nitrogen and aluminum to $10^{18}$ cm$^{-3}$ or higher have been studied as discussed by Scajev et al., "Application of a Time-Resolved Four-Wave Mixing Technique for the Determination of Thermal Properties of 4H—SiC Crystals. *J. Phys. D. Appl. Phys.* 42(5):055413, February 2009 and Tarekegne, et al., "Investigation of the Absorption Mechanisms of SiC for Lighting Applications", *6th International Workshop on Wideband Semiconductor Materials & Devices*, Fujian, China, 2018. Each of these impurities produces a specific near-band-edge absorption band in the visible range. The boron-related optical absorption band peaks at about 430-480 nm for 4H—SiC and at about 450-510 nm for 6H—SiC. The aluminum-related absorption shoulder is at about 410-420 nm and is very close to the band-edge cut-off. The nitrogen-related absorption band is at about 460-470 nm in 4H and at about 620-630 nm in 6H.

While these crystals have been observed to have some optical transparency, they have been found to have very limited optical applications due mostly to optical absorption which may be caused by residual impurities. One approach for minimizing near-band-edge absorption in sublimation-grown 4H and 6H polytype silicon carbide crystals is to reduce the presence of the unwanted background impurities. However, considering the high temperature of the PVT growth process and the use of graphite as a crucible material, reduction of boron and nitrogen background impurities in PVT grown silicon carbide single crystals to levels below $1 \cdot 10^{15}$ cm$^{-3}$ may be, at the very least, viewed as challenging if not even practical.

Thus, there remains a need for additional contributions in this technology.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In one embodiment, a composition includes an aluminum doped silicon carbide crystal having residual nitrogen and boron impurities. The silicon carbide crystal includes a concentration of aluminum in the silicon carbide crystal that is greater than a combined concentration of nitrogen and boron in the silicon carbide crystal and the silicon carbide crystal includes an optical absorption coefficient of less than about 0.4 cm$^{-1}$ at a wavelength in a range between about 400 nm to about 800 nm.

In another embodiment, a method for preparing an aluminum doped silicon carbide crystal includes providing a silicon carbide source material and a silicon carbide monocrystalline seed in a growth crucible. The method also includes providing a solid aluminum dopant source material comprising a compound including aluminum and oxygen in a capsule. The growth crucible is heated, with the capsule positioned therein, in a manner effective for producing silicon and carbon bearing vapors from the silicon carbide source material in the growth crucible and aluminum bearing vapors from the solid aluminum dopant source material in the capsule, and for precipitating the silicon and carbon bearing vapors and the aluminum bearing vapors on the silicon carbide monocrystalline seed to grow the aluminum doped silicon carbide crystal. The capsule includes a first material resistant to degradation from the aluminum dopant source and aluminum bearing vapors and a second material resistant to degradation from the silicon and carbon bearing vapors.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Figure 1:
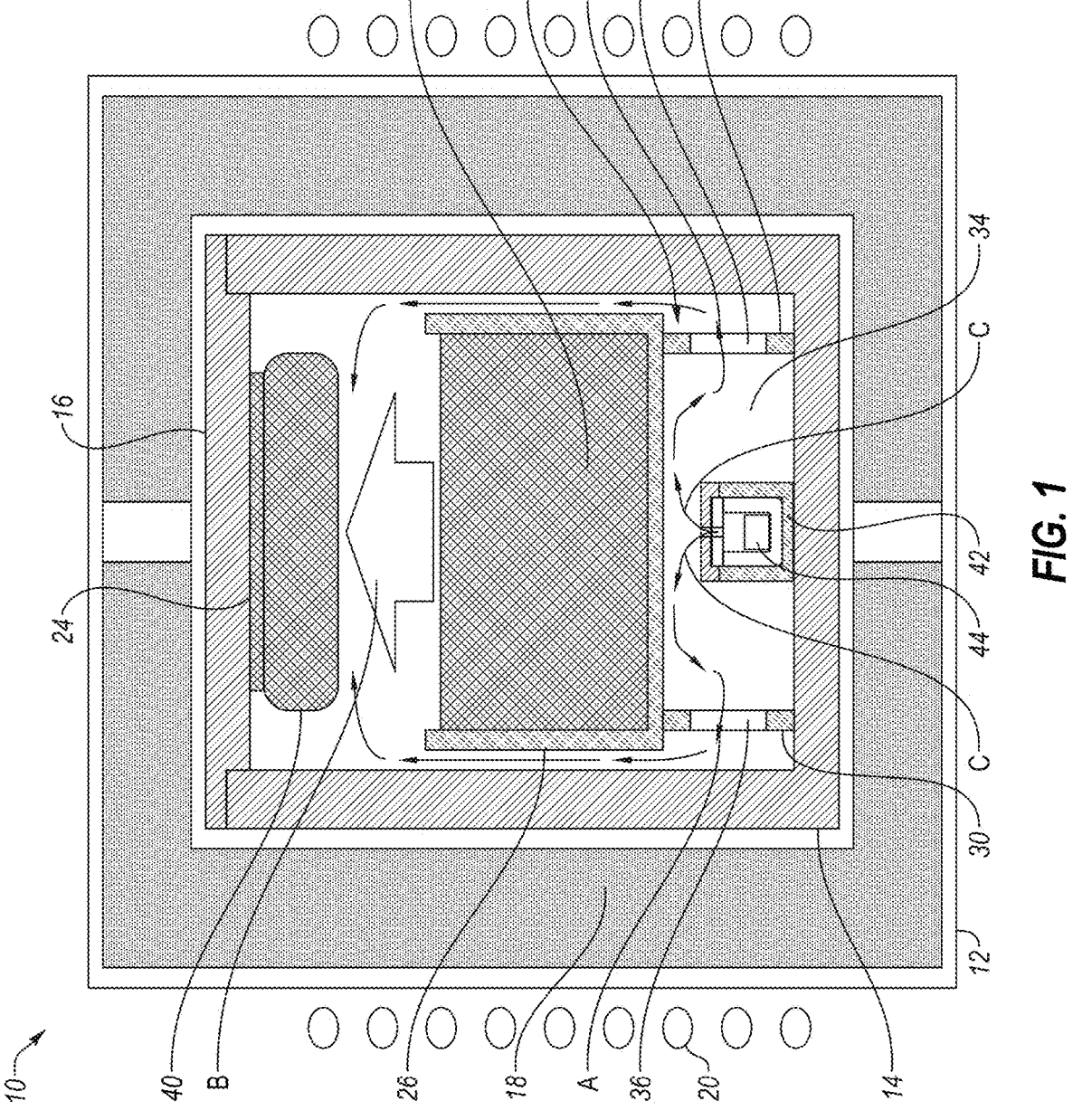
FIG. 1 is a schematic illustration of a system for sublimation growth of aluminum doped silicon carbide crystals.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

The present disclosure generally relates to silicon carbide crystals and to methods for producing the same. More particularly, but not exclusively, the present disclosure relates to silicon carbide crystals which may be suitable for optical applications, and to methods for producing the same. Although various embodiments may be described in the context of use for optical components, such as optical windows, lenses and optical waveguides for example, embodiments disclosed herein may be employed in other fields or operating environments where the functionality disclosed herein may be useful. Accordingly, the scope of the invention should not be construed to be limited to the example implementations and operating environments disclosed herein.

Silicon carbide crystals disclosed herein may be single crystals of a 4H or 6H polytype. In one form, the silicon carbide crystals may have high optical transparency in the visible spectral range. Silicon carbide crystals exhibiting these or similar characteristics may be used in a variety of optical applications, such as, without limitation, optical windows, lenses and optical waveguides operational at wavelengths between about 410 nm and about 750 nm. The sublimation Physical Vapor Transport (PVT) technique, may be used to grow optically transparent 4H and 6H silicon carbide crystals. In one form, silicon carbide single crystals are doped with aluminum and include residual boron and nitrogen impurities. In one aspect, the aluminum dopant is present at a concentration which exceeds the combined concentration of the residual nitrogen and boron impurities and is otherwise below a level which may lead to instability in crystal growth. While not intending to be bound by any particular theory, it is believed the aluminum dopant reduces the magnitude of near-band-edge optical absorption related to the presence of boron and nitrogen impurities. Similarly, maintaining the lowest possible concentrations of background boron and nitrogen impurities may also reduce optical absorption.

As indicated above, silicon carbide single crystals, including those of 4H and 6H polytypes, may be grown using sublimation techniques. In one aspect, these techniques may be designed to reduce or remove boron and nitrogen impurities in or from the growth system. For example, the presence of background boron may be reduced through the use of halogen-purified graphite parts, including, but not limited to, the growth crucible. In one form, halogen purification of a graphite part may include heating the graphite part in a furnace chamber having an atmosphere containing chlorine, fluorine or both chlorine and fluorine. At high temperatures, carbon-bound boron residing in graphite reacts with the gaseous halogens such as chlorine and fluorine and forms volatile halides, such as $BCl_3$ and $BF_3$. A flow of inert gas through the furnace chamber may remove the volatile halides from the furnace chamber. Following this purification, the graphite part may still contain residual boron in concentrations between about 10 and about 100 weight ppb. Similarly, silicon carbide crystals grown by sublimation utilizing these purified graphite parts may still contain residual boron impurity at a concentration of about $10^{15}$-$10^{16}$ $cm^{-3}$.

Reduction or removal of nitrogen impurities in or from the growth system may include pre-growth high temperature baking of the crystal growth hot zone in vacuum. In addition, the sublimation crystal growth may be conducted under a flow of ultra-high-purity argon. Silicon carbide crystals grown under these conditions may still contain residual nitrogen impurity at a concentration of about $10^{15}$-$10^{16}$ $cm^{-3}$.

Given that some residual boron and nitrogen impurities may remain even taking steps for reducing or removing the same, near-band-edge optical absorption due to their presence may still exist. As indicated above however, the addition of an aluminum dopant may be used to reduce the near-band-edge optical absorption caused by the presence of the boron and nitrogen impurities. Similar to boron, aluminum is a shallow acceptor in 4H—SiC and 6H—SiC. In the SiC gap, the energy level of aluminum is located at about 0.2 eV above the valence band maximum (see e.g., Atabaev et al., "Spectral Dependence of Optical Absorption of 4H—SiC Doped with Boron and Aluminum", *J. of Spectroscopy* (2018) Article ID 8705658 and in on-line NSM Archive—Silicon Carbide (SiC) Impurities and Defects).

The lowest energy level of a boron acceptor is at about 0.35 eV above the valance band edge, and above that of aluminum. As an acceptor, aluminum may join boron in compensation of nitrogen—a donor. If aluminum is introduced in a sufficient concentration such that $N_{Al}+N_B>N_N$, all electrons will be stripped from the nitrogen level and hence no electrons will be present at the bottom of the conduction band. Accordingly, the nitrogen-related optical absorption may be reduced or eliminated.

Doping with aluminum will cause redistribution of the electric charge in the silicon carbide crystal, which will be manifested by the shift of the Fermi level position closer to the aluminum level. If aluminum is introduced in a sufficient concentration such that $N_{Al}>N_B+N_N$, the Fermi level will move in a position below the lowest level of boron, thus reducing or eliminating the population of electrons residing on the boron level. Accordingly, the boron-related optical absorption may be reduced or eliminated.

With the above in mind, in order to "depopulate" both boron acceptors and nitrogen donors from electrons, the concentration of the aluminum dopant ($N_{Al}$) exceeds the combined concentration of the residual boron ($N_B$) and nitrogen ($N_N$) as exhibited by equation (1):

$$N_{Al} > N_B + N_N \qquad (1)$$

Doping with aluminum may lead to aluminum related optical absorption, but any such absorption band will be very close to the band-edge cut-off and will practically merge with it.

In 4H and 6H silicon carbide polytypes doped with aluminum, aluminum will substitute for silicon. The covalent radius of aluminum is 1.43 Å while the covalent radius of silicon is 1.17 Å. Given that the radius of aluminum is larger, dissolution of aluminum in the silicon carbide crystal may cause local swelling of the lattice and stress. At certain concentrations of aluminum, formation of crystal defects, misoriented grains and foreign polytypes may occur during silicon carbide crystal growth. These issues may be avoided by maintaining the concentration of aluminum below a certain level, such as, about $5 \cdot 10^{17}$ cm$^{-3}$, although variations are possible.

While aluminum doped silicon carbide single crystals may be grown by adding aluminum carbide ($Al_4C_3$) directly to the silicon carbide solid source, $Al_4C_3$ is not stable at high temperatures and may undergo dissociation by a peritectic reaction into solid carbon and an Al+C liquid with the partial pressure of gaseous aluminum over the liquid exceeding 100 Torr. As a result, there may be an initial spike in aluminum concentration in the crystal followed by rapid depletion of the aluminum source.

U.S. Pat. No. 8,216,369, the contents of which are incorporated herein by reference in their entirety, relates to more spatially uniform doping in the PVT process. For example, it discloses a growth process which includes a doping time-release capsule loaded with a dopant and contained in the interior of the growth crucible. With reference to FIG. 1 of the subject application, there is schematically illustrated a system 10 for sublimation growth of aluminum doped silicon carbide crystals with a more spatially uniform aluminum concentration throughout the crystal. The system 10 includes a chamber 12 within which a growth crucible 14 is positioned. The crucible 14 is sealed with a lid 16 and surrounded by thermal insulation 18. A heating element 20 is positioned around the chamber 12 and is configured to provide heat to the crucible 14. The heating element 20 may be an RF coil or a resistive heating element, although other variations are possible.

Within the crucible 14, a SiC source 22 and SiC seed 24 are disposed in a spatial relationship suitable for PVT crystal growth. More specifically, the SiC seed 24 may be positioned near the top of the crucible 14 and may, for example, be attached or coupled to the lid 16, and the SiC source 22 may be positioned below the SiC seed 24. The SiC source 22 is contained in a crucible 26 which is supported by a support structure 28. The support structure 28 includes a first member 30 spaced from a second member 32, and the first and second members 30 and 32 extend from a lower portion of the crucible 14 toward the lid 16. In this arrangement, the crucible 26, and in turn the SiC source 22 positioned in the crucible 26, are positioned above the lower portion of the crucible 14 and a free space 34 is positioned therebetween. The first member 30 includes an aperture 36 and the second member 32 includes an aperture 38. The apertures 36 and 38 provide fluid communication between the free space 34 and a space positioned between the crucible 26 and the crucible 14 as indicated by the directional arrows A of FIG. 1.

When the crucible 14 is heated by the heating element 20 during sublimation growth of a crystal, the SiC source 22 vaporizes and fills the interior of the crucible 14 with Si-bearing and C-bearing vapors which flow toward the SiC seed 24 as indicated by directional arrow B. The Si-bearing and C-bearing vapors may include volatile molecular species such as Si, $Si_2C$ and $SiC_2$. A vertical temperature gradient may be established across the crucible 14 with the temperature at the lower portion of crucible 14 being higher than the temperature at an upper portion of the crucible 14, such as near the lid 16. A vertical temperature gradient of this nature creates a driving force for vapor transport as indicated by directional arrow B. This vapor transport brings the vapor nutrients from the SiC source 22 to the SiC seed 24. Upon reaching the SiC seed 24, supersaturated vapors precipitate on the SiC seed 24 causing growth of a SiC single crystal 40 on the SiC seed 24.

A time release doping capsule 42, which may be used for aluminum doping, is positioned in the crucible 14 in the free space 34. The doping capsule 42 includes an interior space or chamber for receiving and holding a dopant source 44. In one form, the dopant source 44 is a source of an aluminum dopant and may be in the form of a solid aluminum compound which has a low dissociation pressure at the SiC sublimation growth temperature. In one form for example, the dissociation pressure may be below about 1 Torr, although other variations are possible. Non-limiting examples of solid aluminum compounds which may be used include aluminum compounds containing oxygen such as, without limitation, aluminum carbonate, aluminum silicate and aluminum oxide. In one particular but non-limiting form, the solid aluminum compound is aluminum oxide ($Al_2O_3$) which is also referred to as alumina. The aluminum oxide may be provided in the form of pre-melted alumina "crackle", such as pieces of pure, undoped sapphire. Generally speaking, the amount of the dopant source 44 included in the doping capsule 42 may be sufficient to support aluminum doping throughout the entire crystal growth cycle.

During the crystal growth cycle, the crucible 14 is heated and as the temperature of the crucible 14 increases up to about 2000° C., aluminum compounds containing oxygen undergo chemical transformations that ultimately yield solid aluminum oxide. As the temperature of the crucible 14 further increases and reaches and exceeds the melting point of aluminum oxide of about 2040° C., aluminum oxide melts and fills the interior of the doping capsule 42 with vapors which are products of the aluminum oxide melt volatilization and dissociation. The vapors may include molecules of $Al_2O_3$, $Al_2O$, $AlO$, $Al$ and $O$. At the melting point of aluminum oxide, the total vapor pressure over the melt is on the order of about 0.01 Torr, while at 2200° C., it is less than 0.1 Torr. Similarly, the vapor pressure of molten aluminum oxide should not exceed about 1 Torr provided the temperature of the SiC sublimation growth process does not exceed about 2400° C.

The doping capsule 42 includes a capillary channel, further details of which will be discussed below in connection with FIG. 2, through which the aluminum and oxygen bearing vapors escape the doping capsule 42 and migrate within the crucible 14 as symbolized by directional arrows C in FIG. 1. In the process of migration, these vapors may come in contact with carbon of graphite and react with it to form elemental aluminum vapor and carbon monoxide gas. Eventually, aluminum vapor may reach the silicon carbide crystal growth interface and adsorb on the interface causing aluminum doping of the growing silicon carbide crystal.

The doping capsule 42 may be formed of one or more materials which provide stability in the high-temperature environment of silicon carbide sublimation growth, and against attack by molten alumina and highly corrosive silicon and carbon bearing vapors. With reference FIG. 2 for example, in one non-limiting form, the doping capsule 42 is formed by an outer component 46 and an inner component 48 upon or around which the outer component 46 is formed or positioned. The outer component 46 may be at least partially formed of a first material and the inner component 48 may be at least partially formed of a second, different material.

Figure 2:
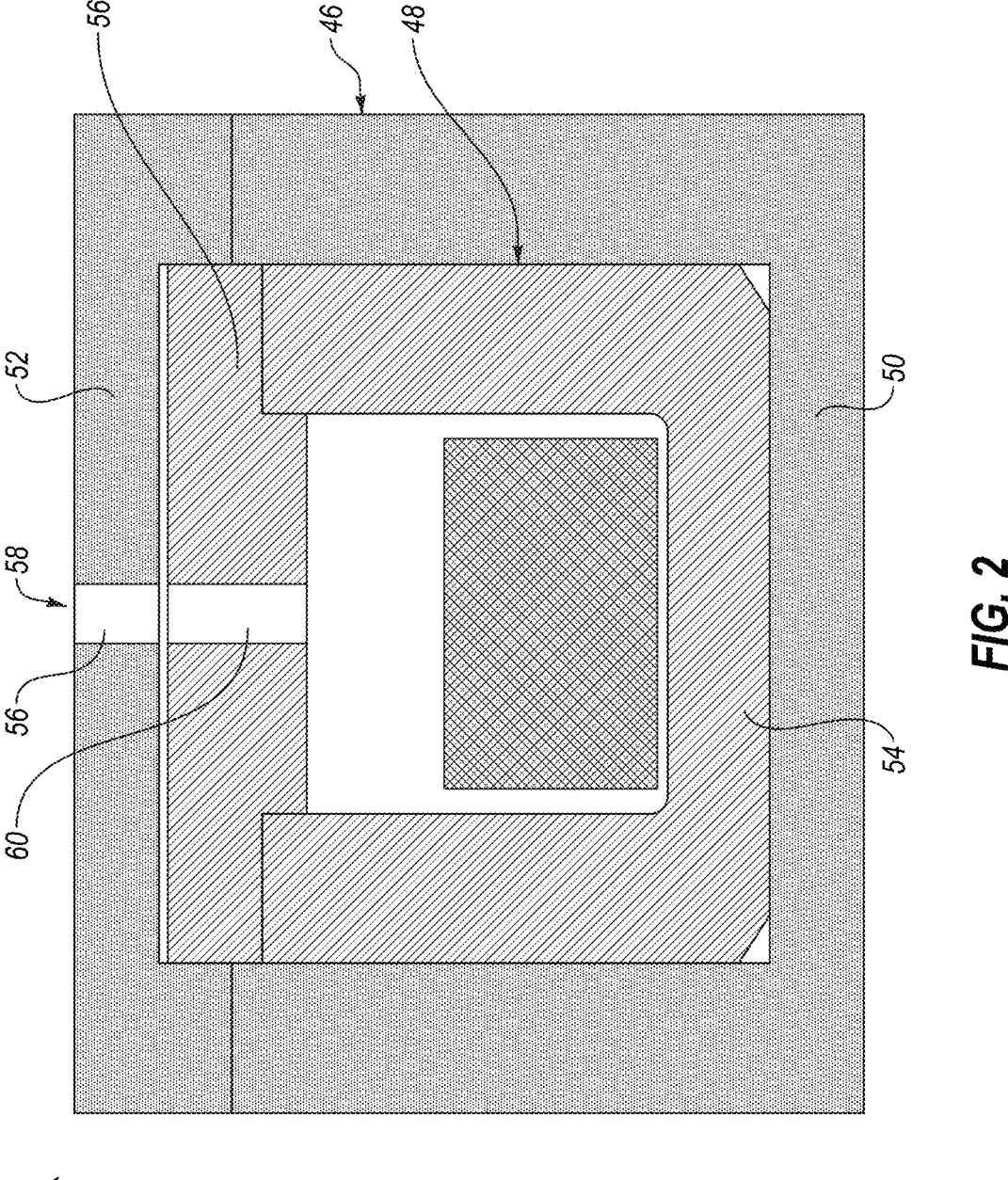
FIG. 2 is a schematic illustration of a doping capsule used in the system of FIG. 1.

In the form illustrated in FIG. 2, the outer component 46 is in the form of a crucible 50 which includes a lid 52. Since the crucible 50 and the lid 52 may be positioned in the free space 34, and in turn may be exposed to silicon and carbon bearing vapors released by the SiC source 22, the crucible 50 and the lid 52 thereof may be at least partially formed of a material that is stable against erosion by silicon and carbon bearing vapors which may be present in the crucible 14. For example, at least an external surface which may come into contact with the silicon and carbon bearing vapors may be formed of a material that is stable against erosion by silicon and carbon bearing vapors. Non-limiting examples of materials which may provide stability of this nature include graphite, carbides of refractory metals, such as tantalum carbide (TaC) or niobium carbide (NbC), and graphite coated with or layered by a refractory carbide. In one particular but non-limiting form, the crucible 50 and the lid 52 thereof may be formed of dense, fine-grain graphite.

In the form illustrated in FIG. 2, the inner component 48 is in the form of a crucible 54 which includes a lid 56. By way of example, the lid 52 of the crucible 50 may be removed to facilitate positioning of the crucible 54 and the lid 56 thereof in the crucible 50, and the lid 52 may be re-engaged with the crucible 50 to secure the crucible 54 and the lid 56 in the crucible 50. Since the crucible 54 and the lid 56 include an interior space or chamber for receiving and holding a dopant source 44 (which may be an aluminum dopant source for example), and in turn may be exposed to molten aluminum oxide, as well as to aluminum bearing vapors released by the dopant source 44, the crucible 54 and the lid 56 thereof may be at least partially formed of a material that is stable against erosion or degradation by molten aluminum oxide or aluminum bearing vapors. For example, at least an internal surface of the crucible 54 and the lid 56 which are disposed toward the dopant source 44 may be formed of a material that is stable or resistant against erosion or degradation by molten aluminum oxide or aluminum bearing vapors. Non-limiting examples of materials which may provide stability of this nature include refractory metal or metal alloys, such as, without limitation, tantalum, molybdenum, tungsten, rhenium or alloys thereof. In one particular but non-limiting form, the crucible 54 and the lid 56 thereof may be formed of tungsten.

While the doping capsule 42 has been described as being formed of separate inner and outer components formed of different materials, it should be appreciated that the doping capsule 42 may also be made from a single component having a composite structure formed from different materials. For example, the different materials may be present in separate layers where one layer of a first material is deposited on a second layer formed of a separate material. In the context of the crucible 54 and the lid 56 for example, these components could be formed a first material and then a second material could be coated or affixed to an exterior surface thereof to provide a structure similar to that illustrated in FIG. 2, although other variations are possible.

As mentioned above, the doping capsule 42 includes a capillary channel 58 through which aluminum and oxygen bearing vapors escape the doping capsule 42 as aluminum oxide is melted. The capillary channel 58 is formed by an aperture 60 through the lid 52 and an aperture 62 through the lid 56. The rate at which aluminum and oxygen bearing vapors may escape or be released from the doping capsule 42 may be at least partially controlled by the temperature at which the aluminum oxide is melted as well as the dimensions of the apertures 60 and 62. For example, a higher rate of escape or release of the aluminum and oxygen bearing vapors from the doping capsule 42 may occur when the temperature at which the molten aluminum oxide is held is higher and the size of the apertures 60 and 62 is larger. In some forms, the size of the apertures 60 and 62 may be the same or different with one or both having a diameter in the range of about 0.1 to about 1.5 mm.

Use of the doping capsule 42 may, for example, facilitate production of sublimation-grown silicon carbide single crystals containing a spatially uniform concentration of aluminum dopant throughout the crystal. The above-described technique may also similarly avoid scenarios where a high aluminum concentration is present in the first-to-grow boule portions of the crystal followed by rapid depletion of the aluminum source. In addition, the aluminum dopant concentration may be controlled such that it exceeds the combined concentration of residual boron and nitrogen while remaining below a level (e.g., about $5 \cdot 10^{17}$ $cm^{-3}$) that leads to the generation of crystal defects.

EXAMPLES

The following examples are for illustration purposes and are not to be construed as limiting the invention disclosed in this document to only the embodiments disclosed in these examples.

Example 1

Four aluminum doped SiC single crystals, two of a 4H polytype and two of a 6H polytype, were grown by sublimation. For the purpose of comparison, two additional SiC boules, one of a 4H polytype and one of a 6H polytype, were grown by sublimation but without aluminum doping. The experimental conditions of sublimation growth as disclosed below are provided with reference to the system 10 described above.

A doping capsule similar to doping capsule 42 of FIG. 2 was prepared. The doping capsule included an inner crucible and lid, corresponding or similar to the crucible 54 and the lid 56, made of pure tungsten available from Plansee USA LLC, 115 Constitution Boulevard, Franklin, MA 02038. The inner crucible had the following dimensions: 25 mm OD×15 mm ID×25 mm high. The lid was 5 mm thick and had a single through hole having a 1.0 mm diameter drilled in the center thereof. An outer crucible and lid, corresponding to the crucible 50 and the lid 52, were made of halogen-purified, dense, isostatic graphite grade IG-11 available from Toyo Tanso USA Inc., 2575 NW Graham Cir, Troutdale, OR 97060. The outer crucible had the following dimensions: 32 mm OD×25 mm ID×30 mm high. The graphite lid was 5 mm thick and had a 1.0 mm diameter hole drilled in the center thereof. The inner crucible fit tightly inside the outer graphite crucible.

Pieces of pure, pre-melted sapphire crackle weighing 7 grams in total were loaded into the inner crucible of the time-release capsule. A graphite growth crucible and lid, similar or corresponding to the crucible 14 and the lid 16, were made from halogen-purified, dense, isostatic graphite grade IG-11 available from Toyo Tanso USA Inc., 2575 NW Graham Cir, Troutdale, OR 97060. Prior to its use in crystal growth, the crucible and lid were halogen-purified to the ash level below 5 ppm by weight. The boron content in the purified graphite was determined to be 30 weight ppb via impurity analysis with a Glow Discharge Mass Spectrometer (EAG LLC, 4747 Executive Drive, Suite 700, San Diego, CA 92121).

The doping capsule was loaded at the bottom of the graphite growth crucible and a source crucible, corresponding or similar to the crucible 26, containing a SiC source was loaded into the graphite growth crucible. The source crucible was placed on a support such that a free space was formed to accommodate the doping capsule. A SiC seed was attached to the lid of the graphite growth crucible and the graphite growth crucible was sealed with the lid. The SiC seeds were 4H—SiC and 6H—SiC wafers 150 mm in diameter. The 4H—SiC seeds were oriented with their growth surface facing the <000-1> crystallographic direction. The 6H—SiC seeds were oriented with their growth surface facing the <0001> crystallographic direction.

The loaded graphite growth crucible was placed into a furnace chamber where it was surrounded by thermal insulation. The chamber was evacuated, and an RF coil was energized to heat the graphite growth crucible to an initial temperature of 1400° C. At this temperature and under continuous pumping, the growth system was soaked for 24 hours to achieve the deepest possible outgassing and to reach the residual pressure of $1 \cdot 10^{-6}$ Torr. The chamber was filled with UHP argon containing less than 10 ppb of residual $N_2$ to a pressure of 5 torr, and a flow of UHP argon of 300 sccm was established across the chamber.

The graphite growth crucible was then heated to a sublimation growth temperature. More specifically, the graphite growth crucible was heated to achieve a temperature of 2180° C. at the top of the crucible and 2210° C. at the bottom of the crucible. The top and bottom temperatures were measured and monitored with an optical pyrometer. The graphite growth crucible was soaked at the above temperatures for a predetermined time period and then cooled to room temperature.

After finishing the growth run, the grown SiC crystal boule was recovered and fabricated into 150 mm diameter× 500-micron thick wafers in accordance with the SEMI standard. The wafers were polished, first mechanically and then using final CMP polishing.

Example 2

Optical properties of the wafers produced in Example 1 were evaluated. This evaluation included the measurements of their optical transmission and reflection. The measurements were carried out for non-polarized light using a spectrophotometer (Agilent Cary 7000 UMS) in the wavelength range from 350 nm to 850 nm. During the measurement of transmission, the angle of incidence (AOI) was 0°. During the measurement of reflection, the AOI was 6°. The coefficients of optical absorption ($\alpha$, cm$^{-1}$) were calculated from the data on transmission and reflection using an approximation of a plate with parallel surfaces, thickness d and infinite number of interior reflections as outlined in *Optical Processes in Semiconductors*, J. I. Pankove, Dover Publ, N Y, 1971, p. 93-94.

Figure 3:
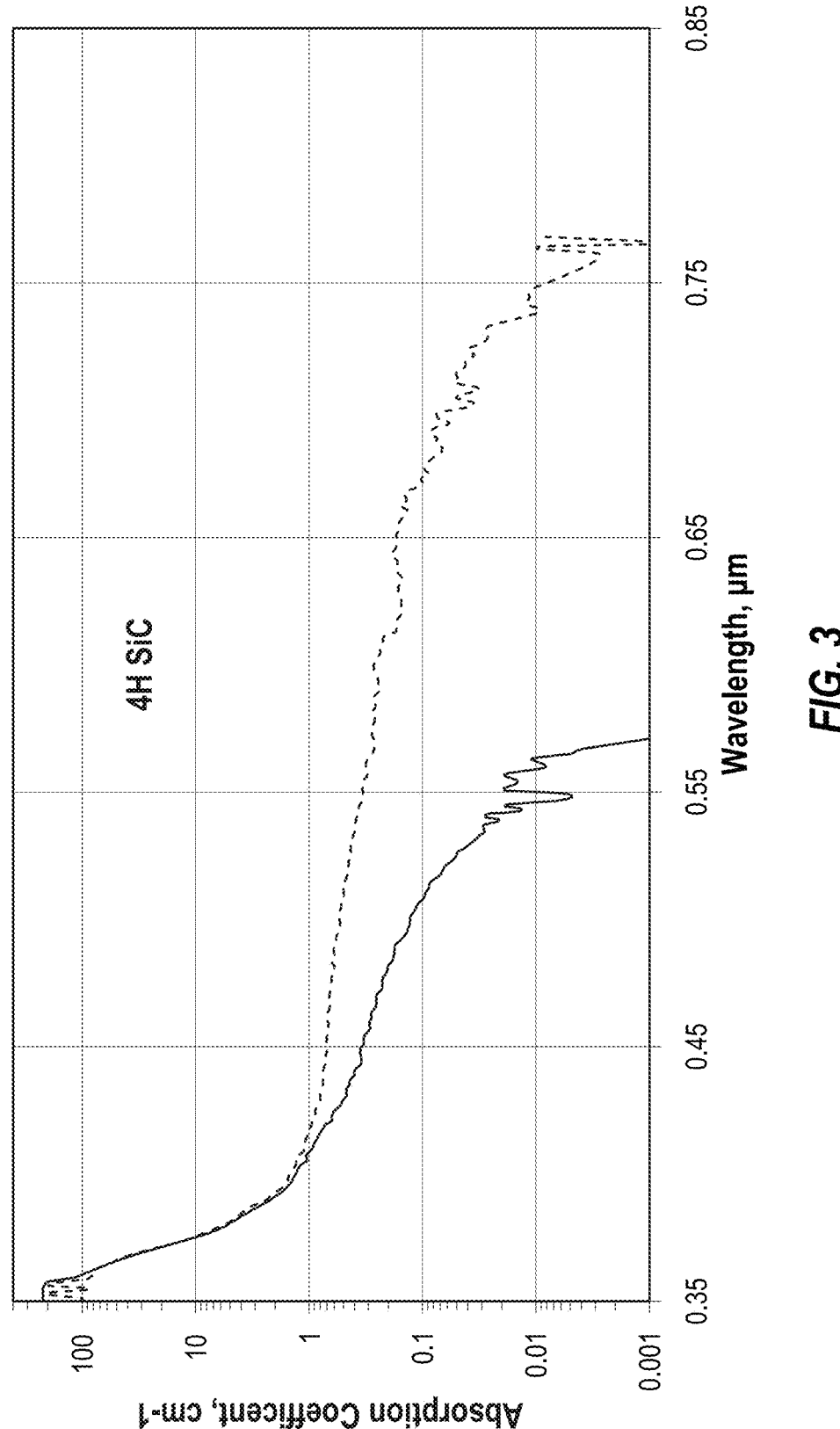
FIG. 3 is a graphical illustration of wavelength dispersions of the optical absorption ($\alpha$, $cm^{-1}$) measured on 4H—SiC wafers.
Figure 4:
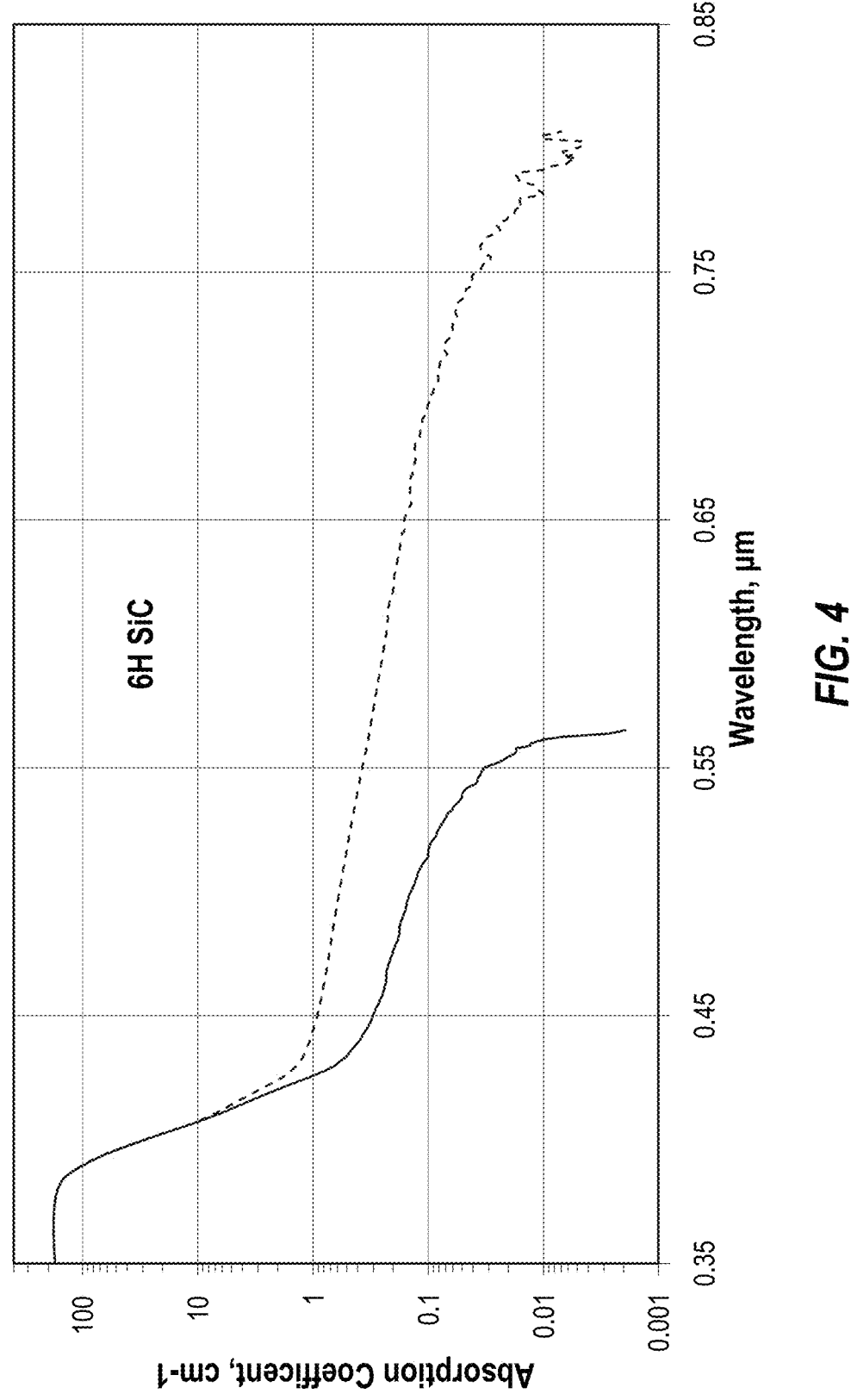
FIG. 4 is a graphical illustration of wavelength dispersions of the optical absorption ($\alpha$, $cm^{-1}$) measured on 6H—SiC wafers.

Wavelength dispersions of the optical absorption ($\alpha$, cm$^{-1}$) measured on some of the 4H—SiC wafers are shown in FIG. 3 and wavelength dispersions of the optical absorption ($\alpha$, cm$^{-1}$) measured on some of the 6H—SiC wafers are shown in FIG. 4. The plots in FIGS. 3 and 4 show absorption coefficients in wafers doped with aluminum (lower curves) and without aluminum doping (upper curves). Following optical measurements, some of the measured wafers were cleaved into smaller pieces, and the fragments were sent for N, B and Al impurity analysis by Secondary Ion Mass Spectroscopy (SIMS) (EAG LLC, 4747 Executive Drive, Suite 700, San Diego, CA 92121). The results of SIMS impurity analysis are shown in Table 2. The measures aimed at reduction of the background B and N contaminants that included the use of halogen purified graphite and extended vacuum bake of the hotzone resulted in the levels of B and N in the grown SiC crystals below $1 \cdot 10^{16}$ cm$^{-3}$. The results of the measurements of the optical absorption coefficients are also shown in Table 1. The SiC crystals in the last two rows of Table 1 were grown without deliberate aluminum doping and are shown in the table for comparison. The obtained results show strong reduction of the optical transmission in the visible spectral range achieved by aluminum doping.

TABLE 1

| Polytype | Growth Direction | Wafer # | SIMS Analysis, cm$^{-3}$ | | | Optical Absorption, $\alpha$ (cm$^{-1}$) | | |
| --- | --- | --- | --- | --- | --- | --- | --- | --- |
| | | | B | N | Al | $\lambda$ = 450 nm | $\lambda$ = 550 nm | $\lambda$ = 650 nm |
| 6H | <0001> | 02 | $6 \cdot 10^{15}$ | $8 \cdot 10^{15}$ | $2 \cdot 10^{17}$ | 0.2 | 0.02 | <0.01 |
| | | 05 | $7 \cdot 10^{15}$ | $4 \cdot 10^{15}$ | $6 \cdot 10^{16}$ | 0.25 | 0.025 | <0.01 |
| 6H | <0001> | 02 | $5 \cdot 10^{15}$ | $8 \cdot 10^{15}$ | $3 \cdot 10^{17}$ | 0.3 | <0.01 | <0.01 |
| | | 07 | $6 \cdot 10^{15}$ | $4 \cdot 10^{15}$ | $9 \cdot 10^{16}$ | 0.22 | <0.01 | <0.01 |

TABLE 1-continued

| Polytype | Growth Direction | Wafer # | SIMS Analysis, cm$^{-3}$ | | | Optical Absorption, $\alpha$ (cm$^{-1}$) | | |
| --- | --- | --- | --- | --- | --- | --- | --- | --- |
| | | | B | N | Al | $\lambda$ = 450 nm | $\lambda$ = 550 nm | $\lambda$ = 650 nm |
| 4H | <000-1> | 02 | $4 \cdot 10^{15}$ | $9 \cdot 10^{15}$ | $2 \cdot 10^{17}$ | 0.32 | 0.02 | <0.01 |
| | | 10 | $5 \cdot 10^{15}$ | $7 \cdot 10^{15}$ | $7 \cdot 10^{16}$ | 0.3 | 0.02 | <0.01 |
| 4H | <000-1> | 02 | $8 \cdot 10^{15}$ | $9 \cdot 10^{15}$ | $1 \cdot 10^{17}$ | 0.31 | <0.01 | <0.01 |
| | | 06 | $7 \cdot 10^{15}$ | $5 \cdot 10^{15}$ | $5 \cdot 10^{16}$ | 0.24 | <0.01 | <0.01 |
| 6H | <0001> | 02 | $5 \cdot 10^{15}$ | $9 \cdot 10^{15}$ | $<5 \cdot 10^{13}$ | 1.2 | 0.4 | 0.2 |
| | | 12 | $4 \cdot 10^{15}$ | $4 \cdot 10^{15}$ | $<5 \cdot 10^{13}$ | 0.95 | 0.3 | 0.15 |
| 4H | <000-1> | 02 | $7 \cdot 10^{15}$ | $8 \cdot 10^{15}$ | $<5 \cdot 10^{13}$ | 0.8 | 0.4 | 0.15 |

What is claimed is:

1. A physical vapor transport system, the system comprising:

a chamber;

a growth crucible positioned within the chamber, the growth crucible being sealable with a growth crucible lid; and a doping capsule positioned within the growth crucible, the doping capsule comprising:

an outer crucible fitted with an outer crucible lid;

an inner crucible fitted with an inner crucible lid, the inner crucible fitted with the inner crucible lid positioned within the outer crucible; and a capillary channel formed by a first aperture in the outer crucible lid and a second aperture in the inner crucible lid.

2. The system of claim 1, further comprising a heating element positioned around the chamber.

3. The system of claim 2, wherein the heating element is a radiofrequency (RF) coil or a resistive heating element.

4. The system of claim 1, further comprising a source crucible contained within the growth crucible, the source crucible separated from an interior bottom surface of the growth crucible by a support structure.

5. The system of claim 4, wherein the support structure comprises:

a first member extending from an outer lower surface of the source crucible to the interior bottom surface of the growth crucible; and a second member spaced apart from the first member, the second member extending from the outer lower surface of the source crucible to the interior bottom surface of the growth crucible, wherein the first member, the second member, the outer lower surface of the source crucible and the interior bottom surface of the growth crucible define a free space within which the doping capsule is positioned, and the first and second members comprise apertures for fluid communication between the free space and a space between the growth crucible and the source crucible.

6. The system of claim 1, wherein at least an external surface of the outer crucible and an external surface of the outer crucible lid comprises graphite and/or a refractory metal carbide.

7. The system of claim 6, wherein the refractory metal carbide is tantalum carbide or niobium carbide.

8. The system of claim 1, wherein the outer crucible and the outer crucible lid are made of graphite.

9. The system of claim 1, wherein at least an internal surface of the inner crucible and an inner surface of the inner crucible lid comprises a refractory metal or refractory metal alloy.

10. The system of claim 9, wherein the refractory metal is tantalum, molybdenum, tungsten, or rhenium.

11. The system of claim 9, wherein the refractory metal alloy is an alloy comprising one or more of tantalum, molybdenum, tungsten, and rhenium.

12. The system of claim 1, wherein the inner crucible and the inner crucible lid are made of tungsten.

13. The system of claim 1, wherein the outer crucible and an external surface of the outer crucible lid are at least partially formed from graphite and/or a refractory metal carbide.

14. The system of claim 13, wherein the refractory metal carbide is tantalum carbide or niobium carbide.

15. The system of claim 1, wherein the inner crucible and the inner crucible lid are at least partially formed from a refractory metal or refractory metal alloy.

16. The system of claim 15, wherein the refractory metal is tantalum, molybdenum, tungsten, or rhenium.

17. The system of claim 15, wherein the refractory metal alloy is an alloy comprising one or more of tantalum, molybdenum, tungsten, and rhenium.

18. The system of claim 1, wherein the capillary channel has a diameter ranging from about 0.1 mm to about 1.5 mm.

19. The system of claim 1, wherein the growth crucible is at least partially surrounded by thermal insulation.

* * * * *